United States Patent [19]

Baker et al.

[11] 4,352,998
[45] Oct. 5, 1982

[54] COMMON MODE REJECTION COUPLER

[75] Inventors: Richard H. Baker, Bedford, Mass.;
Bruce D. Semanchik, Bridgewater,
N.J.

[73] Assignee: Reliance Electric Company,
Cleveland, Ohio

[21] Appl. No.: 138,251

[22] Filed: Apr. 7, 1980

[51] Int. Cl.³ .......................... H03K 3/42; H03F 3/45
[52] U.S. Cl. ..................................... 307/311; 330/258
[58] Field of Search ........................ 330/258; 250/551;
307/311

[56] References Cited

U.S. PATENT DOCUMENTS 3,453,554 7/1969 Shoemaker .......................... 330/258
4,162,456 7/1979 Lukes .................................. 330/258

Primary Examiner—Alfred E. Smith
Attorney, Agent, or Firm—Charles R. Donohoe;
Kenneth Watov

[57] ABSTRACT

A common mode rejection coupler in a power switching system having a variable common mode voltage includes a first optical isolator circuit for receiving an input signal and generating in response thereto a first signal which is normally isolated with respect to the common mode voltage. A second optical isolator circuit receives the complement of the input signal and generates a second signal which is also normally isolated with respect to the common mode voltage. The first and second signals are the complement of one another. A comparator receives the first and second signals and generates an output signal which changes state only when the first and second signals complement states. Feedback control circuitry for the comparator is provided for limiting transient changes in one of the first and second signals to prevent the comparator from changing output states when a transient change occurs in one of the first and second signals resulting from a change in the common mode voltage.

9 Claims, 5 Drawing Figures

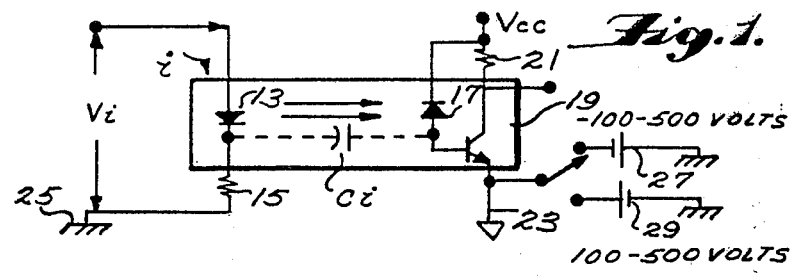

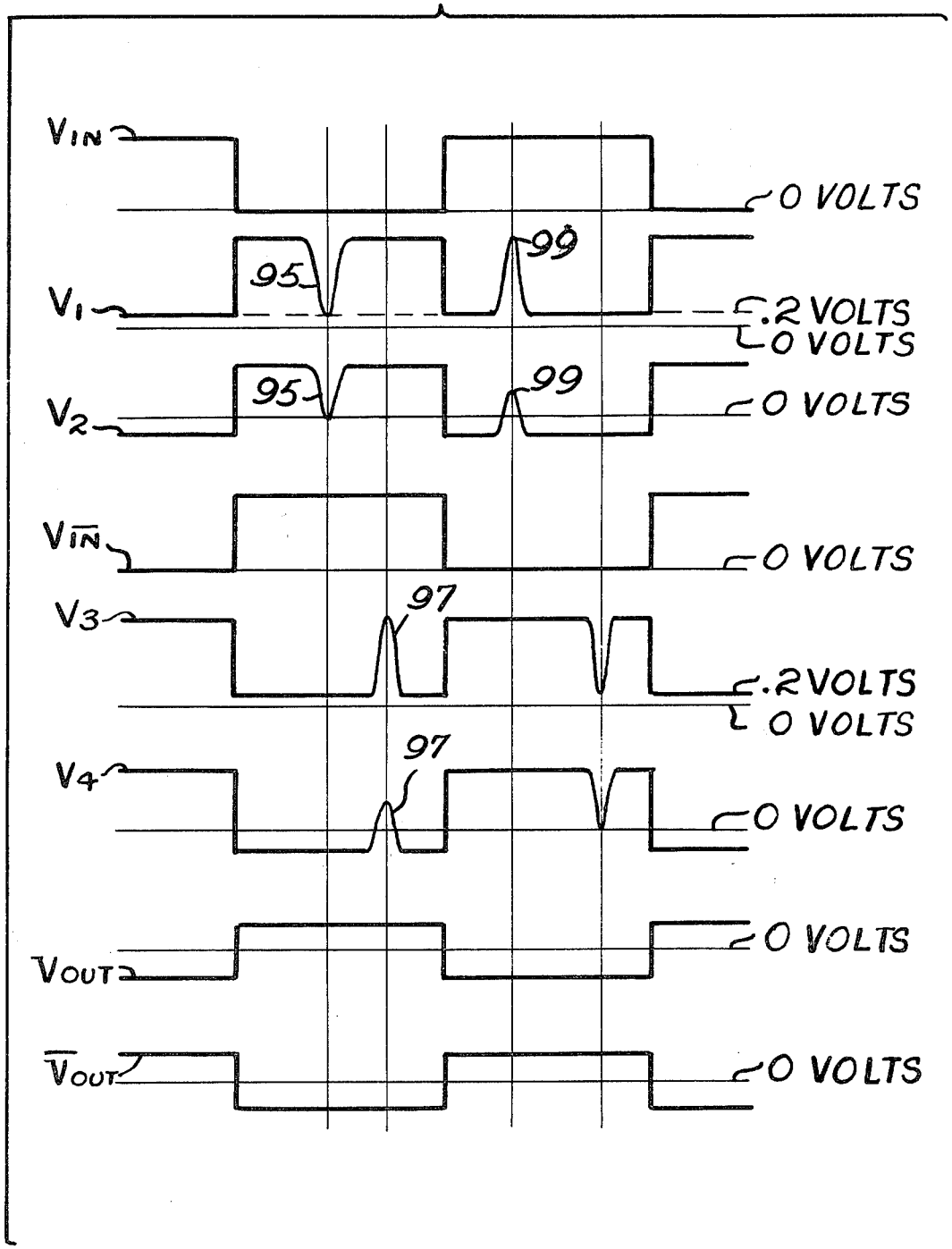

COMMON MODE REJECTION COUPLER

BACKGROUND OF THE INVENTION

This invention relates to a common mode rejection coupler for electrically isolating the input of an electrical system from its output.

The difficulty of coupling a low level signal to a circuit having a transient high level common mode voltage is known in the art. In high voltage or high power switching systems, a low level input logic control circuit provides control signals for an output high level power switch control circuit. Typically, when switching occurs, the reference potential of the high level output circuit changes by several hundred volts with respect to the ground potential of the low level control circuit. The potential difference between the floating reference of the high level switching circuit and the ground of the low level control system is termed the inherent common mode voltage. Among techniques known in the art for effectively rejecting common mode voltages while at the same time effectively utilizing low level signals in systems having high common mode voltages include the use of magnetically coupled current transformers and differential amplifiers. These circuits have some limitations particularly because of low frequency response in the case of a transformer coupling, the inapplicability of differential amplifiers to isolate high common mode voltages, and the lack of flexibility when utilizing other systems known in the art.

More recently, as disclosed in Broderick et al., U.S. Pat. No. 3,978,343, and in Loucks, U.S. Pat. No. 4,032,843, optically coupled isolators have been utilized to reject common mode voltages. In its basic form an optically coupled isolator includes a light emitting diode or similar current-to-light transducer which generates light having an intensity which is proportional to the current. The light thus generated is directed to a photo-sensitive device. The photo-sensitive device in turn generates a current which is proportional to the light intensity. Since photons are unaffected by electric fields, an optical coupler has the capability of isolating rather high common mode voltages. Accordingly, these devices have been utilized in solid state switching systems particularly where a low level logic control circuit controls a high power switching circuit.

One principal problem encountered with prior art optical isolator circuits when switching rapidly changing high voltages is that signal energy is capacitively coupled via the stray capacitance between the light emitting diode and the light sensing diode in the electrical circuit. Accordingly, this rapid transition in the common mode voltage can result in the generation of undesirable spurious or transient signals by the optical isolator which can be passed through the system to effect the operation of the isolated switching circuitry.

In the example of power switching systems, the power switching circuitry is controlled by low level logic control circuitry. The reference potential of the high power switching circuitry floats in potential with respect to the low level logic control circuitry such that the common mode voltage can vary in the range of zero to ±500 volts in a few microseconds. Because of these high voltage transitions the stray capacitance between the light emitting diode and the light sensitive diode couples signals which can cause the faulty switching of the high power switching circuitry. There accordingly is a need in the art for a common mode rejection coupler to eliminate spurious signals resulting from transitions in the common mode voltage.

SHORT STATEMENT OF THE INVENTION

This invention relates to a common mode rejection coupler having a pair of optical isolator circuits for receiving input signals which are the complement for another. The optical isolator circuits generate output signals which are the complement of one another and which are normally isolated from a common mode voltage existing between the input and output of the isolators. The output signals of the two isolator circuits are either driven high or low by the respective input signals and are connected to a comparator which generates at least one output control signal. A feedback control circuit connected at one end to the output of the comparator and at the other end to the input of the comparator limits transient or spurious changes in one of the output signals of the optical isolators to prevent the comparator from changing state when a transient change occurs due to a change in the common mode voltage.

BRIEF DESCRIPTION OF THE DRAWINGS

Other objects, features and advantages of the present invention will become more fully apparent from the following detailed description of the preferred embodiments, the appended claims and the accompanying drawings in which:

FIG. 1 is a schematic diagram of a prior art optical isolator circuit;

FIG. 2 is a schematic diagram of the first preferred embodiment of the present invention;

FIG. 3 is a graphical display of a set of waveforms associated with the circuitry of FIG. 2;

FIG. 4 is a schematic diagram of an alternative preferred embodiment of the present invention.

DETAILED DESCRIPTION OF THE PREFFERED EMBODIMENTS

Figure 5:
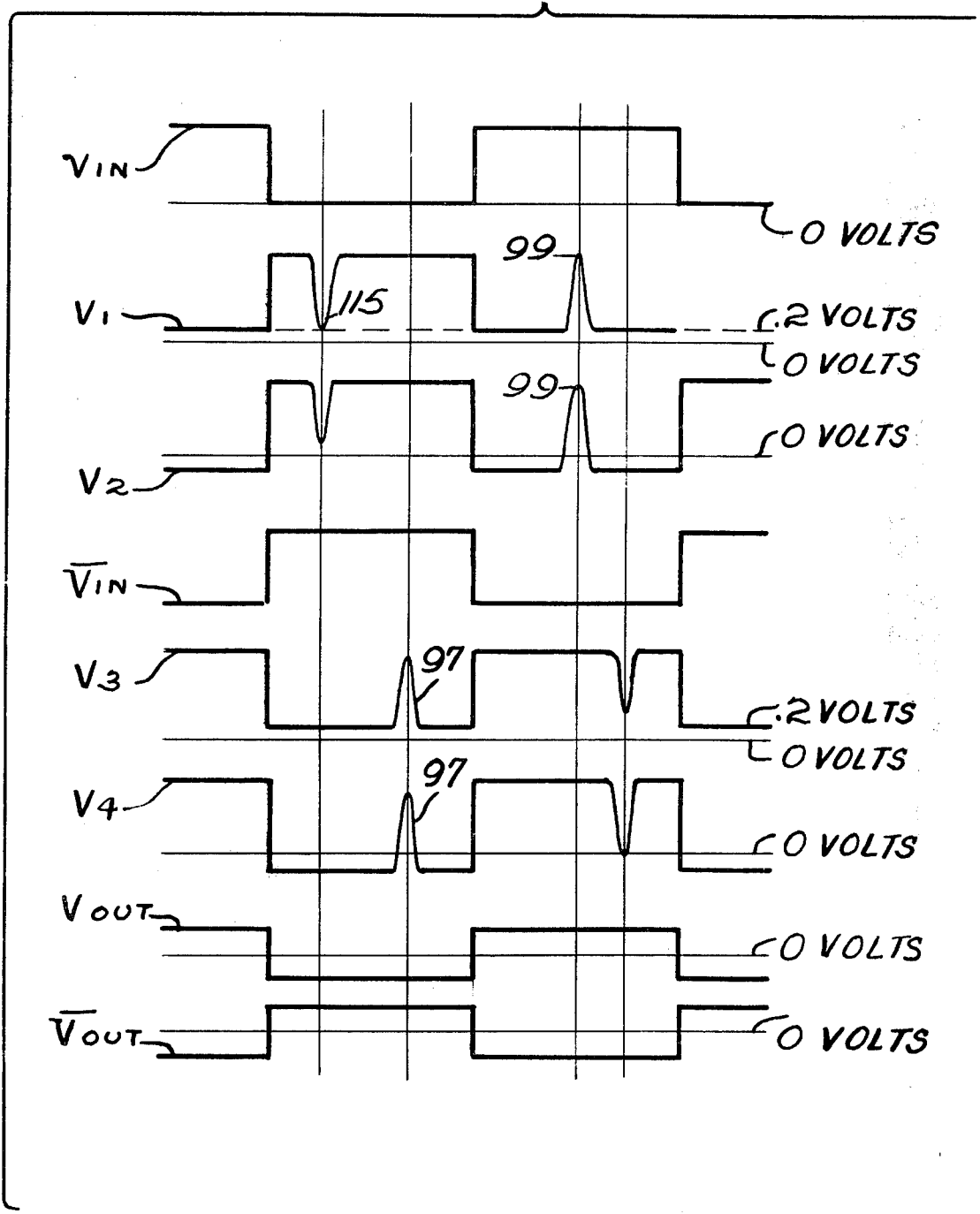
FIG. 5 is a graphical display of a set of waveforms associated with the circuitry of FIG. 4.

Refer now to FIG. 1 which is a schematic illustration of a known optical isolator circuit. As illustrated, the optical isolator circuit includes an input circuit for applying an input voltage across a light emitting diode 13 and a current limiting resistor 15. A light sensing diode 17 is disposed in the path of the radiation emanating from the light emitting diode 13 and produces an output signal which is proportional to the current conducted through the diode 13. The light sensing diode 17 is reverse biased by means by a potential $V_{cc}$ derived from a power supply. The electrical current thus generated by the light sensing diode 17 is coupled to an amplifier which in the illustrated embodiment is a transistor 19 but which can be any suitable amplifier circuitry known in the art.

The transistor 19, light sensitive diode 17 and load resistor 21 are referenced to a floating around 23 while the light emitting diode 13 and current limiting resistor 15 are connected to a fixed reference ground 25. When the circuitry illustrated is utilized in a power switching system, the floating reference 23 becomes the high power switch ground which, as illustrated by means of the batteries 27 and 29, can vary between, for example, zero to ±500 volts in a few microseconds. While this voltage range is set out here by way of example, it should be understood that other voltage ranges can be experienced by the optical isolator circuit illustrated in FIG. 1.

The drawback to the circuit illustrated in FIG. 1 is that a stray capacitance $C_i$ is established between the light emitting diode 13 and the light sensing diode 17. As a consequence of this stray capacitance, changes in the common mode voltage, i.e., changes in the voltage difference between the floating ground 23 and the fixed referene ground 25, are capacitively coupled by means of the stray capacitance $C_i$ into the circuit of the light sensing diode 17 and as differentiated by the capacitor $C_i$ will appear as a transient or spurious voltage across the load resistor 21 at the output of transistor 19. In order to overcome the problem of coupling the changes in the floating ground level 23, i.e., changes in the common mode voltage being coupled through the amplifier circuit, an improved system for isolating the input circuitry from the output circuitry has been developed by applicants.

Refer now to FIG. 2 which is a schematic block diagram of a preferred embodiment of the present invention. As illustrated in FIG. 2, an input voltage $V_i$ which may be a low level logic control signal in a power switching system is coupled to an input circuit 35 of an optical isolator circuit 41. The input circuit includes a current limiting resistor 37 and a light emitting diode 39. As aforementioned, the voltage $V_i$ generates a current i which causes light to be emitted by diode 39 having an intensity which is proportional to the current level. The light is directed toward light sensing diode 43 by fiber optics or other means known in the art. The current generated by the light sensing diode 43 in turn is proportional to the input voltage $V_i$. This current drives amplifier 45 which may be of any type well-known in the art, but, as illustrated, is a conventional bipolar transistor. The emitter of transistor 45 is connected to a floating reference 47 whereas the input circuit 35 is referenced with respect to a fixed ground 25.

The output signal of the optical isolator 41 is coupled to a voltage divider network comprising resistors 49, 51 and 53. The values of these resistors are such that when the transistor 45 is turned on, the voltage at point $P_1$ is 0.2 volts which is the saturation voltage across the emitter-collector terminals of the transistor 45 whereas when the transistor 45 is turned off, the voltage at point $P_1$ is some fraction of the supply voltage $V_{cc}$ depending upon the respective values of the resistors 49, 51 and 53. The voltage at point $P_2$ is coupled to one input of a dual output, high speed comparator 55.

An input circuit 65 of a second optical isolator 71 receives the complement of voltage $V_i$, i.e., $\overline{V}_i$, which is coupled across a light emitting diode 69 and a current limiting resistor 67. The input circuit 65 is referenced with respect to the fixed ground 25. On the output side of the optical isolator circuit 71 is a light sensitive diode 73, the output of which drives transistor amplifier 75. The output of optical isolator circuit 71 is referenced with respect to the floating ground 47 which, as aforementioned, may vary from zero to ±500 volts with respect to the fixed ground 25 in a power switching system. The output of the optical isolator 71 is connected to a voltage divider comprising resistors 79, 81 and 83. The voltage at point $P_3$ is that across the emitter-collector terminals of transistor 75, i.e. about 0.2 volts, when the transistor 75 is turned on and is some portion of the supply voltage $V_{cc}$ when transistor 75 is turned off. The voltage at point $P_4$ is coupled to the other input of the dual output comparator 55.

The dual output comparator has a pair of feedback circuits for the purpose of limiting spurious inputs to the comparator 55 under transient conditions as will be explained below. In the preferred embodiment, the first output 85 of the comparator 55 is coupled in a feedback path via diode 87 and resistor 89 to point $P_2$. The other output 91 of the comparator 55 is connected back to the input of the comparator via diode 93 and resistor 95. One or both of the outputs 85 and 91 are connected to a high power switch control circuit if the common mode system coupler of FIG. 2 is utilized in a power switching system.

The operation of the circuit of FIG. 2 will now be explained by reference to FIG. 3 which is a graphical display of the waveforms associated with the circuitry of FIG. 2. The first waveform $V_{in}$ represents the input voltage $V_i$ to the optical isolator 41 which as illustrated is a square wave. The waveform $V_i$ is the voltage at point $P_1$ at the output of the optical isolator circuit 41. The voltage waveform $V_2$ represents the voltage at point $P_2$ which as illustrated is in-phase with the voltage at the output of the optical isolator circuit 41 but is attenuated and shifted negatively because of the feedback circuit comprising resistor 89 and diode 87. Thus when the input signal $V_i$ to circuit 35 is high, the output of the optical isolator circuit 41 is low and vice versa. This signal is attenuated at point $P_2$ because of the voltage divider network including resistors 49, 51 and 53 and, depending on the output state of comparator 55, is also attenuated by the feedback network including diode 87 and resistor 89. At the same time, the complement of the voltage $\overline{V}_i$ is coupled to the input circuit 65 of isolator circuit 71 and is represented in the graphical display of FIG. 3 as $\overline{V}_{in}$. This signal is converted to a corresponding voltage at the output of the optical-isolator at point $P_3$ and is represented in the graphical display as waveform $V_3$. This voltage is attenuated at point $P_4$ by the resistors 79, 81 and 83 and depending on the output state of comparator 55, is also attenuated or limited by the feedback diode 93 and resistor 95. The voltage at point $P_4$ is graphically displayed as voltage $V_4$ in FIG. 3.

The voltages at point $P_2$ and $P_4$ are coupled to the comparator circuit 55. When the voltage at point $P_2$ is positive with respect to the voltage at point $P_4$, the output $V_0$ goes positive and the output $\overline{V}_0$ goes negative. Conversely, when the input voltage at point $P_4$ is positive with respect to the voltage at point $P_2$, the output voltage $V_0$ goes negative and the output voltage $\overline{V}_0$ goes positive. The output voltages $V_0$ and $\overline{V}_0$ are graphically displayed in FIG. 4 at $\overline{V}_{out}$ and $V_{out}$, respectively.

Assume now that during the course of switching, the floating reference 47 goes negative with respect to the fixed ground 25 of the input circuits. This is represented in waveforms $V_1$ and $V_2$ as the negative going transient spike 95 but does not appear in the waveforms $V_3$ and $V_4$ since these voltages are already held to a minimum voltage level which corresponds to the saturation voltage across the output of transistor 75. The voltage spike 95 cannot drop below the saturation output voltage of the transistor 45. At the same time, since the output voltage $\overline{V}_0$ of the comparator 55 is fed back to the input thereof via resistor 95 and diode 93, the voltage level at point $P_4$, which is at the input of the comparator, is locked to a lower level, such as, for example, −1.5 volts. This is always lower than the 0.2 minimum voltage level at the output of isolator circuit 41. Thus, when a negative going spurious voltage is coupled across the stray capacitance of the optical isolator circuit 41, the voltage spike will not cause the output of the comparator 55 to change or complement states.

Assume now that the reference 47 goes positive with respect to the fixed ground 25. This is represented by the positive going transient spike 97 in waveforms $V_3$ and $V_4$ of FIG. 3. The positive going spike does not appear in waveforms $V_1$ and $V_2$ since the output amplifier 45 of the optical isolator circuit 41 is already turned on. The signal attenuation caused by the feedback resistor 95 and diode 93 in combination with resistors 81 and 83 limits the peak value of spike 97 to a value less than the voltage at point $P_2$. Thus, spike 97 cannot cause comparator 55 to change its output state.

When, however, the values of input voltages $V_i$ and $\overline{V_i}$ reverse, the outputs of the comparator 55 are switched so that the voltage $V_0$ goes negative and the voltage $\overline{V_0}$ goes positive. Now assume that the floating reference level 47 goes positive with respect to the fixed ground level of the input circuits 35 and 65. A positive going spike 99 will appear at the output of the optical isolator circuit 41 but will not appear at the output of the optical isolator circuit 71 since this circuit is already turned full on. The positive going spike is illustrated in FIG. 3 in waveforms $V_1$ and $V_2$ as the spike 99. When the output $V_0$ of the comparator is negative, the diode 87 is forward biased and, accordingly, the input voltage at point $P_2$ to comparator 55 is determined by the sum of the currents at point $P_2$. Therefore, the voltage at point $P_2$ is limited to some value less than the maximum possible level when no feedback current flows through feedback resistor 89. Since the corresponding voltage spike does not appear at the other input to the comparator, the value of the voltage at point $P_2$ is always less than that at point $P_4$ when output voltage $V_0$ is negative and, accordingly, a voltage transient caused by a changing common mode voltage will not cause the comparator 55 to switch. Of course, if the respective input voltages $V_i$ and $\overline{V_i}$ synchronously complement states, the output of the comparator switches as desired.

Thus, FIG. 2 illustrates a high noise immunity, common mode rejection circuit which may be used, for example, in high power switching circuits. It should be appreciated, however, that the circuitry of FIG. 2 could be used for other purposes wherein isolation of the input and output circuits is desired.

It should be understood that isolation circuits other than an optical isolator may be utilized which provide an output which is normally isolated with respect to an input circuit and bistable circuits other than the illustrated comparator could be used in keeping with the present invention.

Refer now to FIG. 4 which is a schematic diagram of an alternate preferred embodiment of the present invention. In this circuit a first optical isolator 41 is illustrated having an input circuit 35 which is referenced to a fixed ground level 29. The output of the optical isolator circuit 41 is referenced to a floating ground 47. The output of the optical isolator circuit 41 is coupled to a diode 105 and a switching circuit 107 which in the preferred embodiment is a conventional FET semiconductor switch, however, it should be appreciated that any suitable switch having the necessary switch speed could be utilized in the circuit of FIG. 4. The output of the switch 107 is coupled to one input of a dual, high speed comparator 55. The output $V_0$ of the comparator 55 is coupled back to the control input of the switch 107 to control the opening and closing of the switch 107 in a known manner.

A second optical isolator circuit 71 is provided having an input circuit 65 which is referenced to the fixed ground level 29. The output of the optical isolator 71 is referenced to the floating ground 47. The output of the optical isolator 71 is connected to a second switching circuit 109 and to a second diode 111. The switch 109, in the preferred embodiment, is a conventional FET switch, of the same type as switch 107. The diode 111 and the output terminal of the switch 109 are connected to the other input of the high speed comparator 55. The output $\overline{V_0}$ of the comparator 55 is connected back to the control input of the switch 109 to thereby control the opening and closing of the switch 109 in a known manner.

In operation, a first input voltage $V_i$, which is illustrated in FIG. 5 as waveform $V_{in}$, is coupled to the input circuit 35 of isolator circuit 41 and a second complementary input voltage $\overline{V_i}$ illustrated in FIG. 5 as waveform $\overline{V_{in}}$, is coupled to the input circuit 65 of isolator circuit 71. The output voltage of optical isolator circuit 41 at point $P_1$ is illustrated in FIG. 5 as waveform $V_1$. In a similar manner the output voltage of isolator circuit 71 at point $P_3$ is the complement of the voltage at point $P_1$ and is illustrated in FIG. 5 as waveform $V_3$. When the voltage at point $P_1$ is high and the voltage at point $P_3$ is low, the output voltage $V_0$ is high and the output voltage $\overline{V_0}$ is low. The output voltages $V_0$ and $\overline{V_0}$ are represented by waveforms $V_{out}$ and $\overline{V_{out}}$, respectively in FIG. 5.

When $V_0$ is high and $\overline{V_0}$ is low, switch 107 is closed and switch 109 is opened. With switch 107 closed, the input voltage to the comparator 55 from switch 107 is substantially the same as that at the output of isolator 41. On the other hand, with switch 109 open, a voltage drop of, for example, −1.5 volts appears across the diode 111 and, accordingly, the voltage at point $P_4$ goes slightly negative with respect to the voltage at $P_2$. If, for example, a negative going spike appears at the output of isolator circuit 41 due to the floating ground level 47 going negative with respect to the fixed ground 25, a negative going spike 115 appears at point $P_1$. This signal is coupled through the switch 107 to the input of the comparator. However, since the other input of the comparator is locked to a level lower than the lowest possible input voltage to the comparator from switch 107 when that switch is closed, the comparator cannot be switched. Similarly, if a positive going voltage is generated at the output of isolator circuit 71 due to the potential of ground 47 going positive with respect to the potential of the fixed ground 25, the maximum positive going voltage spike is limited by means of diode 111 to a value which is 1.5 volts less than the maximum possible voltage input to the comparator 55. Thus, once again, the input voltage at point $P_4$ cannot go positive with respect to the input voltage at point $P_2$ when switch 107 is closed and switch 109 is open. The opposite situation occurs when the input voltage $V_i$ is negative or low and the input voltage $\overline{V_i}$ is positive or high. In this case the switching circuit 109 is closed and switching circuit 107 is open. In this case positive or negative going spikes caused by changes in the common mode voltage between fixed ground 25 and floating reference 47 cannot cause the state of the high speed comparator 55 to change because of the feedback controlled switching circuits 107 and 109.

While the preferred embodiments of the present invention have been disclosed herein in detail, it should be appreciated that there may be other embodiments of applicants' invention which fall within the spirit and scope of the invention as defined by the appended claims.

What is claimed is:

1. In a circut having a comon mode voltage between the input and the output thereof, a common mode rejection coupler comprising:

a first circuit means for receiving an input signal and for generating a first signal in response thereto, said first circuit means normally isolating said first signal with respect to said common mode voltage;

a second circuit means for receiving the complement of said input signal and for generating a second signal in response thereto, said second circuit means normally isolating said second signal with respect to said common mode voltage, said second signal being the complement of said first signal;

a comparator for receiving said first and second signals and for generating at least one output signal, said comparator changing the output signal state when said first and second signals complement states; and means connected to the output of said comparator for limiting the magnitude of transient changes in one of said first and second signals to less than the magnitude of the non-transient difference between said first and second signals, said limiting means preventing said comparator from changing state when a common mode transient voltage change occurs in one of said first and second signals.

2. In a circuit for rejecting common mode voltage coupling between the input and output thereof, a common mode rejection coupler comprising:

a first circuit means for receiving an input signal and for generating a first signal in response thereto, said first circuit means normally isolating said first signal with respect to said common mode voltage;

a second circuit means for receiving the complement of said input signal and for generating a second signal in response thereto, said second circuit means normally isolating said second signal with respect to said common mode voltage, said second signal being the complement of said first signal, said first and second circuit means generating transient changes in one or the other of said first and second signals when said common mode voltage changes;

a comparator for receiving said first and second signals and for generating at least one output signal, said comparator changing the output signal state when said first and second signals complement states; and means connected to the output of said comparator for limiting the magnitude of transient changes in one of said first and second signals to less than the magnitude of the non-transient difference between said first and second signals, said limiting means preventing said comparator from changing state when a common mode transient voltage change occurs in one of said first and second signals.

3. In a power switching system having a low level input logic control circuit and a high level output power switch control circuit wherein a variable common mode voltage exists between said input and output circuits, a common mode rejection coupler comprising:

a first circuit means for receiving an input signal and for generating a first signal in response thereto, said first circuit means normally isolating said first signal with respect to said common mode voltage;

a second circuit means for receiving the complement of said input signal and for generating a second signal in response thereto, said second circuit means normally isolating said second signal with respect to said common mode voltage, said second signal being the complement of said first signal, said first and second circuit means generating transient changes in one or the other of said first and second signals when said common mode voltage changes;

a comparator for receiving said first and second signals and for generating at least one output signal, said comparator changing the output signal state when said first and second signals complement states; and means connected to the output of said comparator for limiting the magnitude of transient changes in one of said first and second signals to less than the magnitude of the non-transient difference between said first and second signals, said limiting means preventing said comparator from changing state when a common mode transient voltage change occurs in one of said first and second signals.

4. The common mode rejection coupler of claim 3, wherein said limiting means comprises a feedback means connected between the input and output of said comparator for limiting transient changes in one of said first and second signals to prevent said comparator from changing state when a transient change occurs in one of said first or second signals.

5. The common mode rejection coupler of claim 3, wherein said comparator generates two output signals, one being the complement of the other, and wherein said limiting means comprises a first negative feedback circuit connected between a first output of said comparator and a first input thereof, and a second negative feedback circuit connected between the second output of said comparator and the second input thereof, said negative feedback circuits limiting transient changes in one of said first or second signals to prevent said comparator from changing state when a transient change occurs in one of said first or second signals.

6. The common mode rejection coupler of claim 3, wherein said comparator generates two output signals, one being the complement of the other, and wherein said limiting means comprises a first negative feedback circuit connected between a first output of said comparator and a first input thereof, and a second negative feedback circuit connected between the second output of said comparator and the second input thereof, said negative feedback means limiting the level of the lower of said first and second signals to a value less than the other of said first and second signals except when said first and second signals complement states.

7. The common mode rejection coupler of claim 3, wherein said limiting means comprises signal level control circuit means connected between said first and second circuit means and said comparator, said signal level control circuit means including signal attenuating means for selectively attenuating one of said first and second signals and switching means for conducting the other of said first and second signals past said attenuating means to said comparator, and feedback control means for selectively controlling said switching means in accordance with the output of said comparator wherein said signal level control circuit limits transient changes in one of said first and second signals to prevent said comparator from changing state when a transient change occurs in said one of said first and second signals resulting from a change in said common mode voltage.

8. The common mode rejection coupler of claim 3, wherein said limiting means comprises first and second signal level control circuits connected respectively between said first and second circuit means and said comparator, said first and second signal level control circuits each including attenuating means for attenuating said first and second signals and switching means for bypassing said attenuating means; and feedback control means connected between said output of said comparator and each of said switching means for controlling said switching means wherein, when the switching means of one of said signal level control circuits is closed, the switching means of the other signal level control circuit is opened to thereby selectively attenuate one or the other of said first and second signals and wherein said signal level control circuits limit transient changes in one of said first and second signals to prevent said comparator from changing state when a transient charge occurs in said one of said first and second signals resulting from a change in said common mode voltage.

9. The common mode rejection coupler of claim 3, wherein said first and second circuit means each comprise an optical isolator circuit having an input circuit for receiving said input signal, said input circuit including a light emitting diode and being referenced to a fixed ground; and an output circuit, said output circuit including a light sensitive diode for receiving the light generating by said light emitting diode and for generating a signal proportional to the intensity of said light, a common mode voltage existing between said input and said output circuits, said input and output circuits being capacitively coupled.

* * * * *